(12) United States Patent
Chen et al.

(10) Patent No.: US 7,388,759 B2
(45) Date of Patent: Jun. 17, 2008

(54) MOUNTING ASSEMBLY FOR EXPANSION CARDS

(75) Inventors: Yun-Lung Chen, Tu-Cheng (TW); Lin Ding, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 92 days.

(21) Appl. No.: 11/321,164

(22) Filed: Dec. 29, 2005

(65) Prior Publication Data

US 2007/0153493 A1 Jul. 5, 2007

(51) Int. Cl.
*H05K 7/18* (2006.01)
(52) U.S. Cl. ..................... 361/801; 361/802
(58) Field of Classification Search ........... 361/801, 361/802, 755, 796, 756–759; 312/223.1–223.2
See application file for complete search history.

(56) References Cited

U.S. PATENT DOCUMENTS 6,138,839 A * 10/2000 Cranston et al. ......... 211/41.17
6,231,139 B1  5/2001 Chen
6,357,603 B1  3/2002 Dingman
6,480,392 B1 * 11/2002 Jiang ..................... 361/755
6,552,913 B2  4/2003 Tournadre
6,960,720 B2 * 11/2005 Wen-Lung ................. 174/50
7,193,863 B2 * 3/2007 Tullidge et al. ........... 361/801

* cited by examiner

*Primary Examiner*—Tuan Dinh
*Assistant Examiner*—Yuriy Semenenko
(74) *Attorney, Agent, or Firm*—Morris Manning Martin LLP; Tim Tingkang Xia, Esq.

(57) ABSTRACT

A mounting assembly includes a chassis having a wall, a fastener pivotally attached to the wall, and a cover detachably attached to the chassis. The wall forms a support portion for supporting a slot cover of an expansion card thereon. The fastener includes a pressing portion for pressing the slot cover against the support portion when the fastener is pivoted to a locked position. The cover is engagable with the fastener to secure the fastener in the locked position.

15 Claims, 6 Drawing Sheets

MOUNTING ASSEMBLY FOR EXPANSION CARDS

BACKGROUND OF THE INVENTION

1. Field of the Invention

The present invention relates to mounting assemblies, and more particularly to a mounting assembly which readily and firmly secures a plurality of expansion cards in a computer chassis.

2. General Background

Nowadays, most computer systems or other electronic devices employ a plurality of circuit cards, such as expansion cards, adapters, and PC boards. These cards or boards are typically mounted to a computer motherboard in a perpendicular fashion relative to the computer motherboard. In particular, the cards are usually inserted into edge card connectors, which are mounted on the computer motherboard. However, merely inserting a card into an edge card connector is typically insufficient to securely maintain the card within the computer chassis. A card connected in this fashion could easily disconnect from the edge card connector, which may prevent, or significantly inhibit, acceptable operation of the computer. Accordingly, additional structure is normally required to secure a card within a computer chassis. A conventional manner of securing a card within a computer chassis is to provide a card bracket fastened to the computer chassis with a removable screw. Specifically, each mounting bracket is normally disposed across a card slot formed in the computer chassis and may include an aperture through which the fastener screw may pass. However, securing a card-mounting bracket to a computer chassis by using a screw that passes through the bracket and into the computer chassis may present problems. One significant disadvantage of a screw-secured bracket is that the screw is often inadvertently dropped into the computer chassis during installation and removal of the bracket.

A typical mounting assembly for securing expansion cards includes a rear panel and a fixing cover attached to the rear panel. The rear panel defines a plurality of expansion slots for receiving expansion cards. A fixing plate is stamped from the rear panel adjacent to an end of the expansion slots and forms a plurality of protrusions. Each expansion card includes a slot cover forming a bent portion for abutting against the fixing plate. Each bent portion defines a cutout for engaging with the protrusion of the fixing plate thereby positioning the expansion card. The fixing cover forms a plurality of elastic tabs for pressing the bent portion of the slot cover thereby fixing the expansion card. A pair of through holes is defined in the fixing cover and a pair of screw holes is correspondingly defined in the rear panel. A pair of bolts extends through the through holes and threadedly engages in the screw holes thereby fixing the fixing cover to the rear panel. However, the above-described operation of the mounting assembly for securing expansion cards is comparatively complicated.

What is needed, therefore, is a mounting assembly which readily and firmly secures a plurality of expansion cards to a computer chassis.

SUMMARY

A mounting assembly includes a chassis having a wall, a fastener pivotally attached to the wall, and a cover detachably attached to the chassis. The wall forms a support portion for supporting a slot cover of an expansion card thereon. The fastener includes a pressing portion for pressing the slot cover against the support portion when the fastener is pivoted to a locked position. The cover is engagable with the fastener to secure the fastener in the locked position.

Other advantages and novel features will be drawn from the following detailed description of preferred embodiments with the attached drawings, in which:

DETAILED DESCRIPTION OF THE EMBODIMENTS

Figure 1:
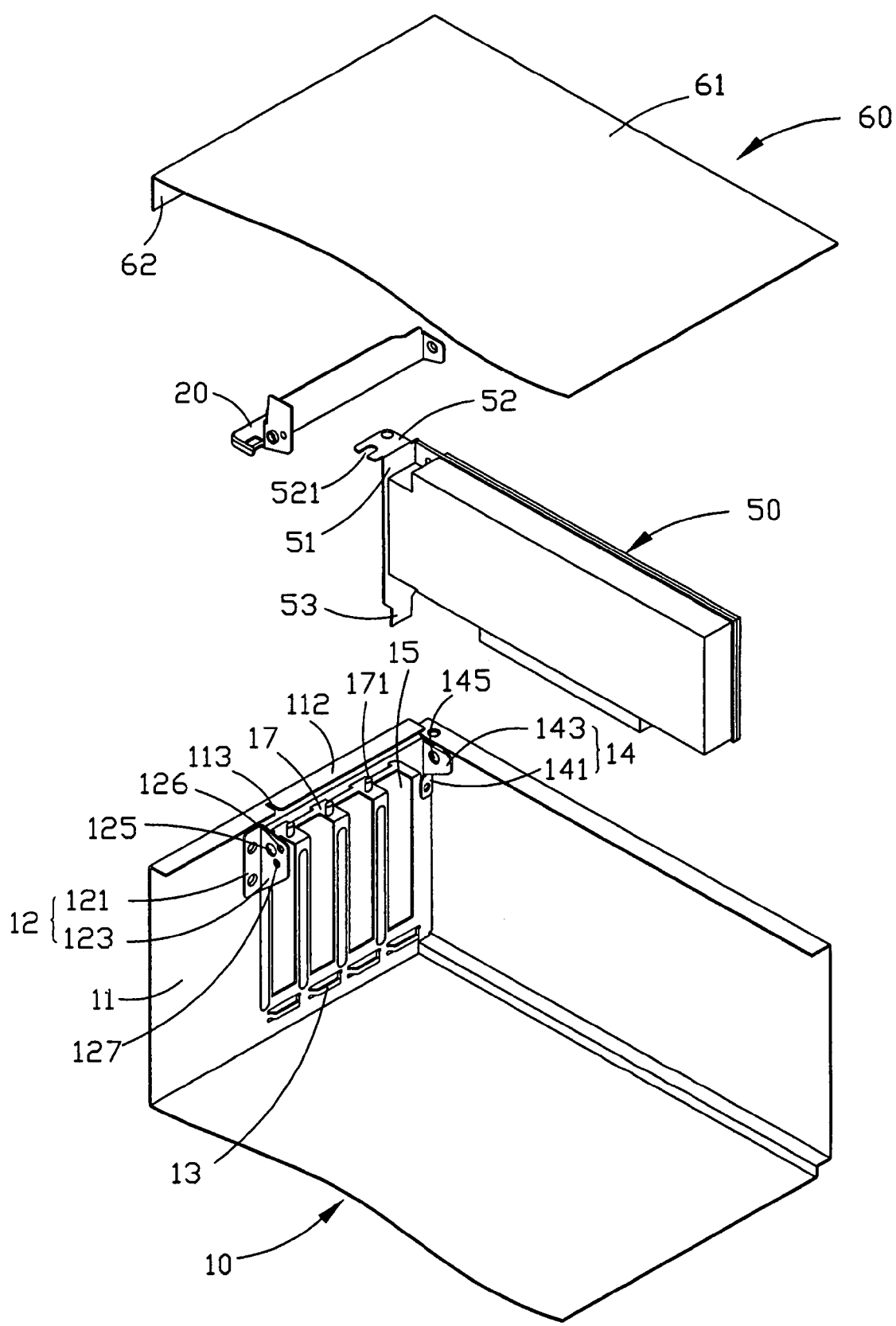
FIG. 1 is an exploded, isometric view of part of a mounting assembly in accordance with a preferred embodiment of the invention, the mounting assembly including a computer chassis, a fastener, a expansion card, and a top cover.

Referring to FIG. 1, a mounting assembly of an electronic device like a computer in accordance with a preferred embodiment of the invention, which secures a plurality of expansion cards to a computer chassis, includes a computer chassis 10, a fastener 20, an expansion card 50, and a top cover 60.

The computer chassis 10 includes a rear wall 11. A top edge of the rear wall 11 is bent horizontally to form a flange 112. The flange 112 defines a narrow cutout 113 therein. A first supporting member 12 and a second supporting member 14 are securely mounted to the rear wall 11. The first supporting member 12 has a mounting portion 121, and a supporting portion 123 connected perpendicularly with the mounting portion 121. The mounting portion 121 can be securely fixed to the rear wall 11 by a well-known method, such as by a screw, a rivet, or by welding. The supporting portion 123 defines a pivot hole 125 therein. A first positioning hole 126 and a second positioning hole 127 are defined in the supporting portion 123, situated on the same circular orbit. The second supporting member 14 has a mounting portion 141, and a supporting portion 143 connected perpendicularly with the mounting portion 141. The mounting portion 141 can be fixedly secured to the rear wall 11 by a well-known method, such as by a screw, a rivet, or by welding. The supporting portion 143 defines a pivot hole 145 therein. The rear wall 11 forms a horizontal support plate 17 by stamping between the first and second supporting members 12, 14. A plurality of juxtaposed expansion card slots 15 is defined in the support plate 17 and the rear wall 11. A protruding post 171 is formed on the support plate 17 between adjacent each expansion card slot 15. A receiving portion 13 is defined in the rear wall 11 below each expansion card slot 15.

The expansion card 50 has a slot cover 51 perpendicularly attached to a rear edge thereof. The slot cover 51 has a bent fixing portion 52 at a free end thereof, and an insert portion 53 at an opposite end thereof. The fixing portion 52 defines a U-shaped cutout 521 therein.

The top cover 60 is detachably mounted to the computer chassis 10. The top cover 60 includes a main body 61, and a flange 62 connected perpendicularly with the main body 61.

Figure 2:
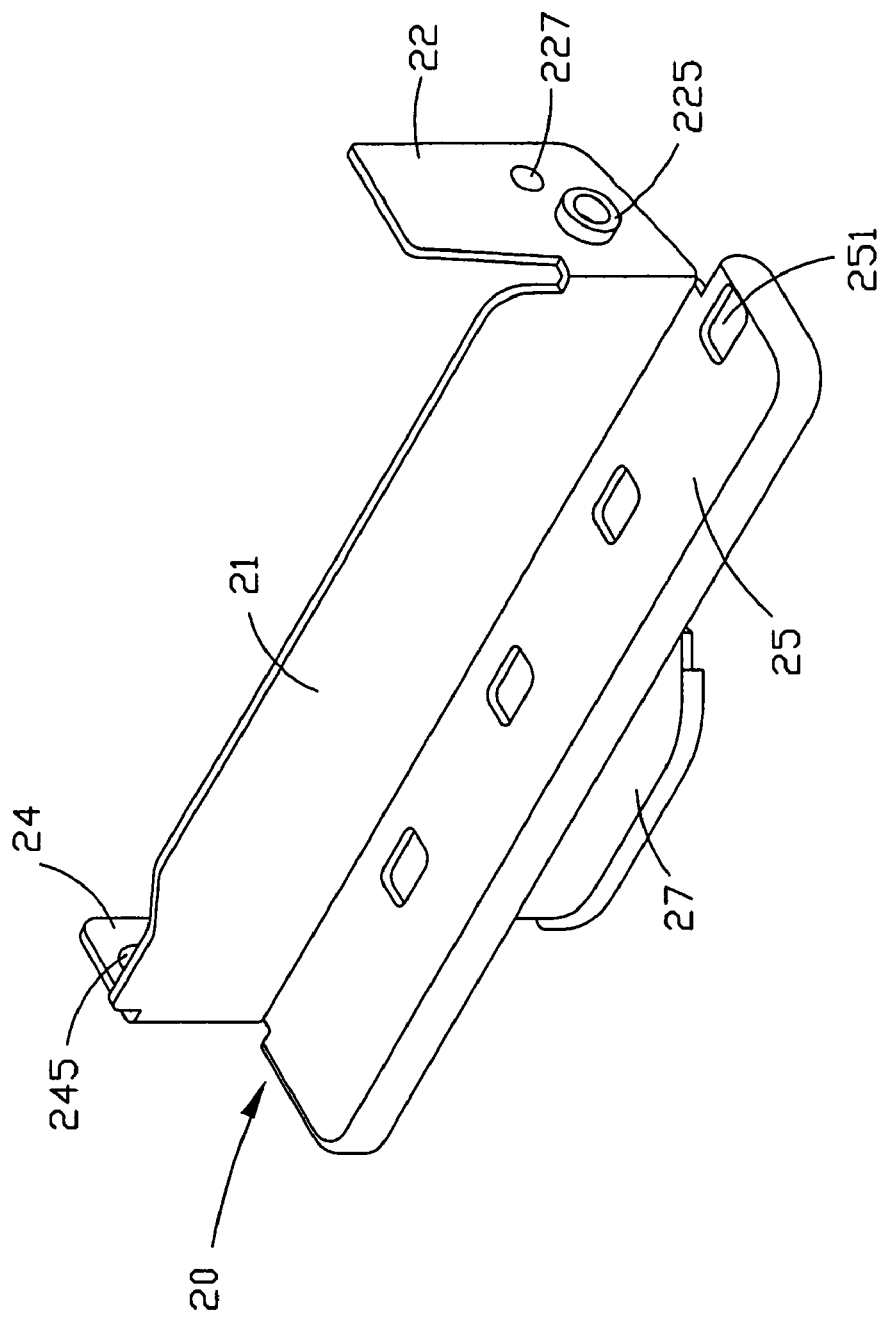
FIG. 2 is an enlarged view of the fastener of FIG. 1, but viewed from another aspect.

Referring to FIG. 2, the fastener 20 has a vertical portion 21 and a horizontal pressing portion 25 connected perpendicularly with the vertical portion 21. Two opposite free ends of the vertical portion 21 are bent perpendicularly to form a first flap 22 and a second flap 24. A first pivot pin 225 is formed on the first flap 22, and a projection 227 is also formed on the first flap 22, adjacent to the first pivot pin 225. A second pivot pin 245 is formed on the second flap 24. The pressing portion 25 defines a plurality of through holes 251 for extension of the protruding posts 171 therethrough. An operating portion 27 is formed on one side of the pressing portion 25 for conveniently operating the fastener 20.

Figure 3:
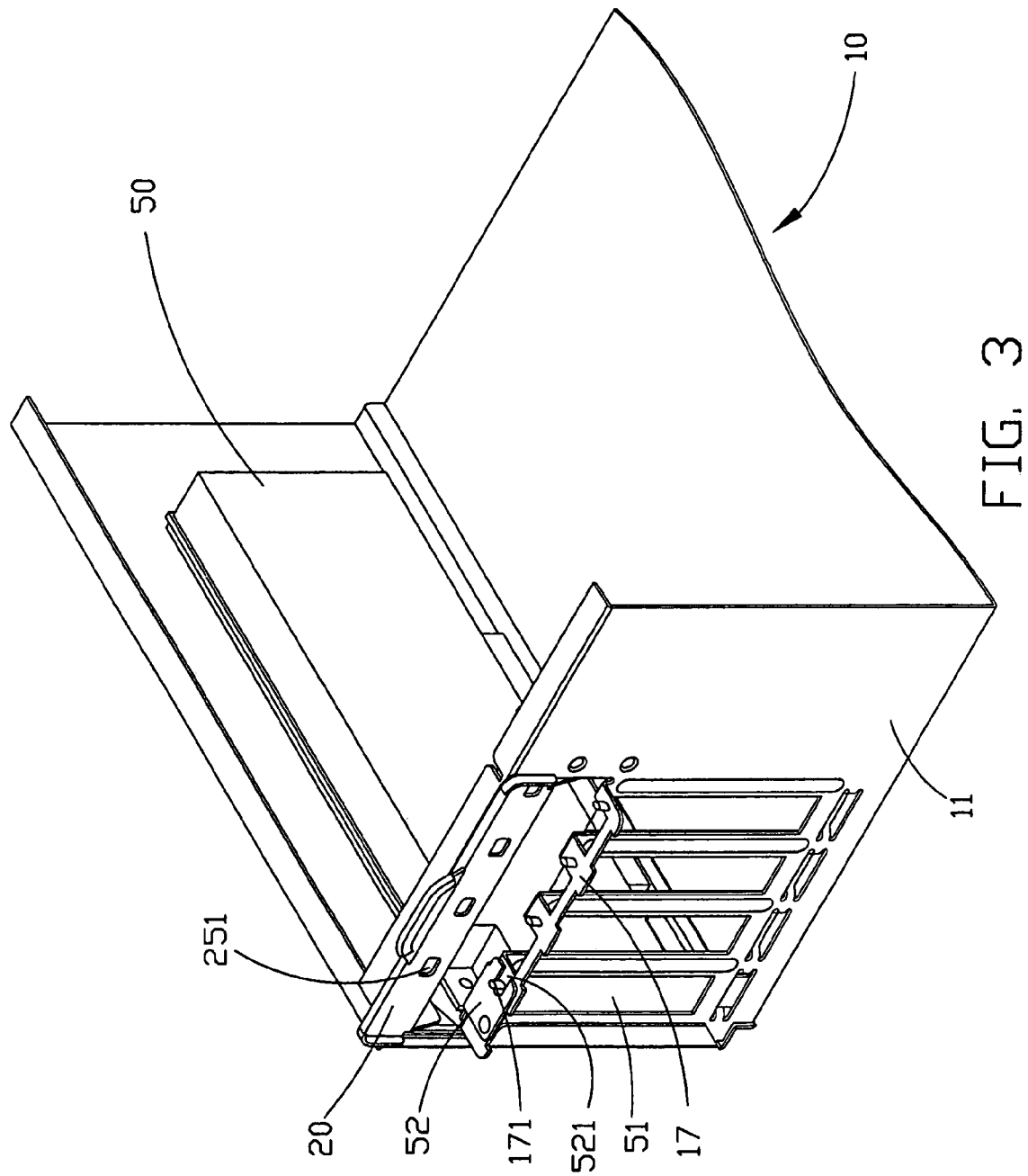
FIG. 3 is a pre-assembled view of part of the mounting assembly of FIG. 1.
Figure 4:
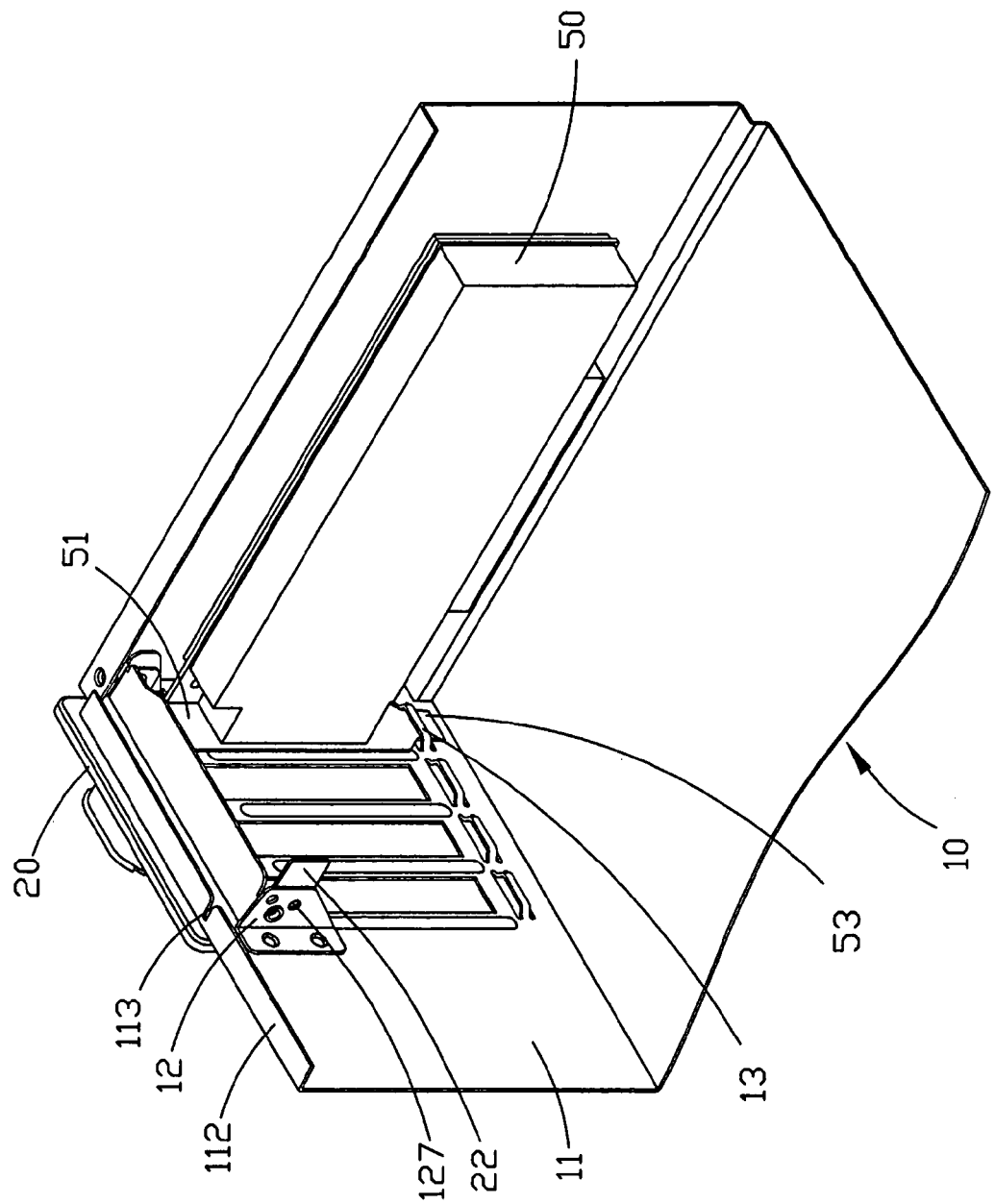
FIG. 4 is a pre-assembled view of part of the mounting assembly of FIG. 1, but viewed from another aspect.

Referring also to FIGS. 3 and 4, in pre-assembly of the mounting assembly, the first and second pivot pins 225, 245 of the fastener 20 are first mounted to the pivot holes 125, 145 respectively, thereby allowing rotation of the fastener 20 about the first and second pivot pins 225, 245. The fastener 20 is pivoted upward until the projection 227 of the first flap 22 engages in the second positioning hole 127 of the first supporting member 12. This is the unlocked position and the mounting assembly is ready to receive the expansion card 50. The insert portion 53 of the slot cover 51 inserts into the receiving portion 13 of the chassis 10. At the same time, the fixing portion 52 is disposed on the support plate 17, and the protruding post 171 of the support plate 17 extends through the cutout 521 of the fixing portion 52, thereby engaging in the cutout 521. Then, the fastener 20 is pivoted downward until the projection 227 of the first flap 22 engages in the first positioning hole 126 of the first supporting member 12. This is the locked position and the pressing portion 25 of the fastener 20 cooperates with the support plate 17 of the rear wall 11 to sandwich the fixing portion 52 of the slot cover 51 therebetween. The expansion card 50 is thus locked in position.

Figure 5:
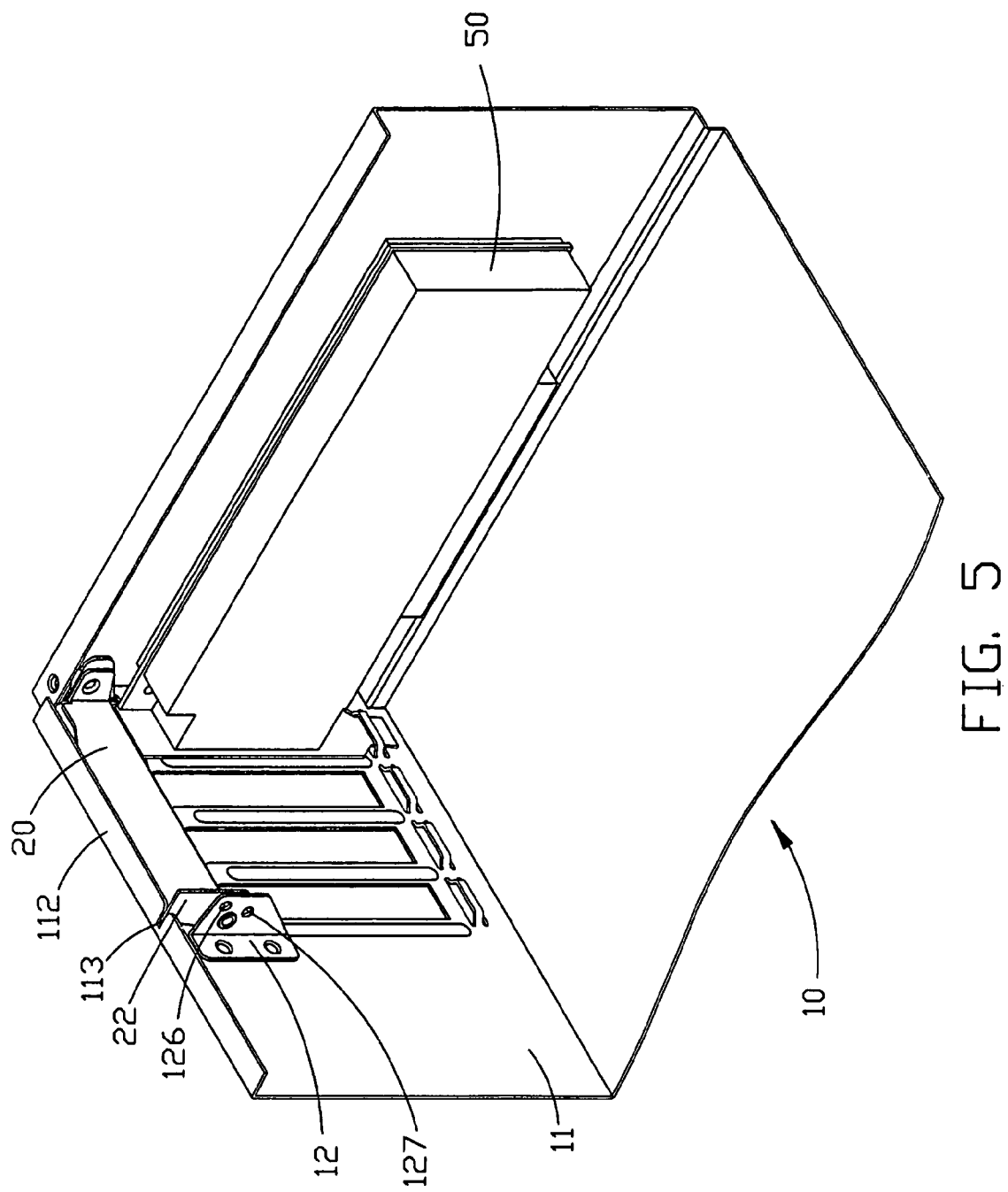
FIG. 5 is an assembled view of part of the mounting assembly of FIG. 1.
Figure 6:
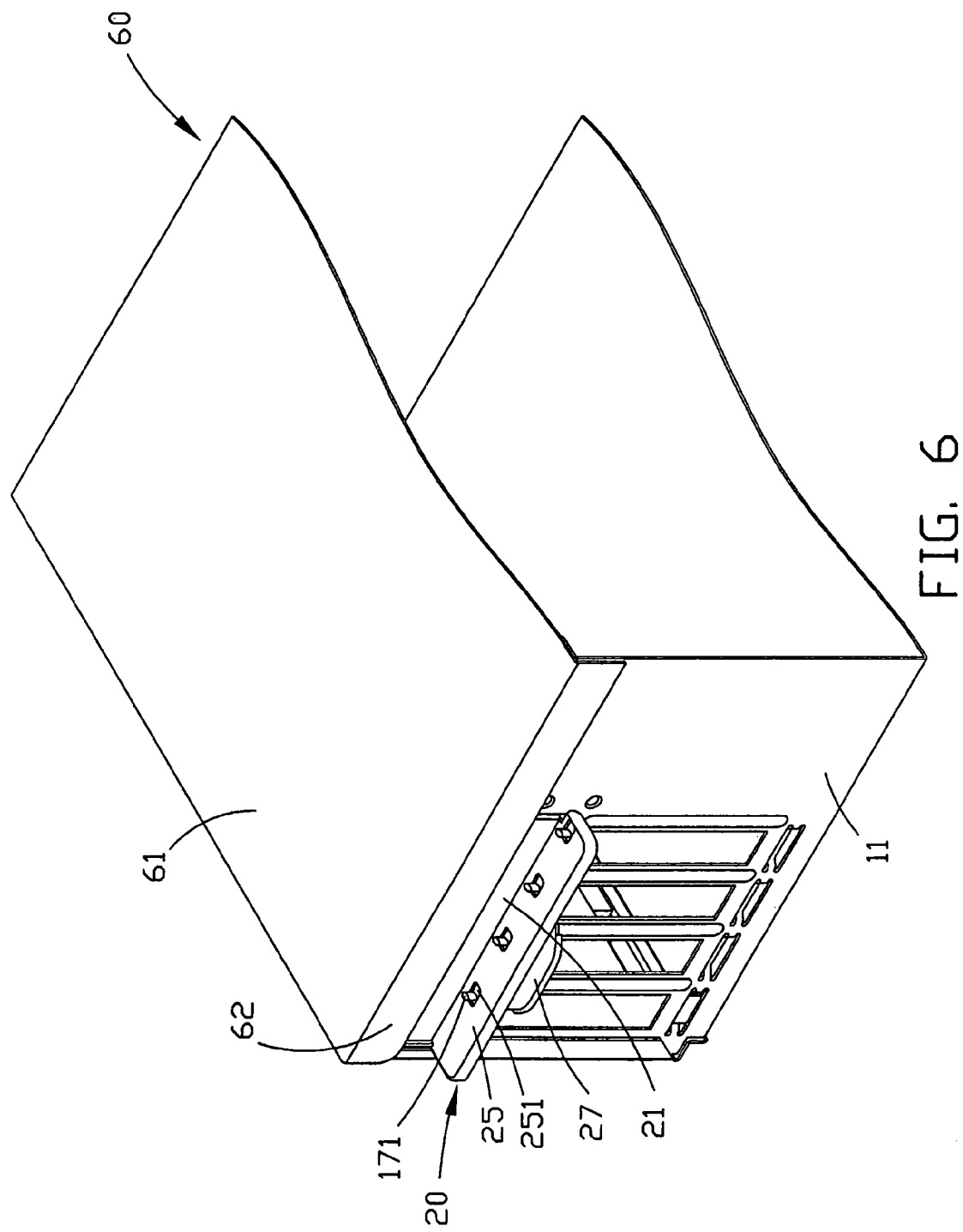
FIG. 6 is another assembled view of part of the mounting assembly of FIG. 1, with the top cover mounted to the computer chassis.

Referring to FIGS. 5 and 6, in assembly of the expansion card 50, the operating portion 27 of the fastener 20 is pulled down to urge the fastener 20 to pivot about the first and second pivot pins 225, 245 of the fastener 20. When the projection 227 of the first flap 22 disengages from the second positioning hole 127 of the first supporting member 12, and the projection 227 engages in the first positioning hole 126 of the first supporting member 12, the pressing portion 25 of the fastener 20 tightly presses on the fixing portion 52 of the slot cover 51. Because the projection 227 engages in the first positioning hole 126, the fastener 20 is prevented from further rotation. Simultaneously, the protruding post 171 of the support plate 17 extends through the through hole 251 of the fastener 20, thereby fixedly mounting the expansion card 50 to the computer chassis 10. Moreover, a top end of the first flap 22 snappingly engages in the narrow cutout 113 of the flange 112 of the rear wall 11. Finally, the top cover 60 is mounted to the computer chassis 10. The main body 61 of the top cover 60 presses on the top end of the first flap 12, thereby further blocking the fastener 20 from rotating. The flange 62 of the top cover 60 abuts against the rear wall 11 of the computer chassis 10. Thus, the expansion card 50 is securely mounted to the computer chassis 10.

In removal of the expansion card 50, the top cover 60 is first removed from the computer chassis 10. The operating portion 27 is pushed upward to urge the fastener 20 to rotate until the top end of the first flap 22 disengages from the narrow cutout 113 of the rear wall 11 and the projection 227 of the first flap 22 disengages from the first positioning hole 126 of the first supporting member 12. Thus, the fixing portion 52 of the slot cover 51 is released. When the projection 227 engages in the second positioning hole 127 of the first supporting member 12, the expansion card 50 can be easily removed from the chassis 10.

In addition, in another preferred embodiment, different locating structures may be arranged on the chassis 10 and the fastener 20, for locating the fastener 20 with respect to the rear wall 11. For example, the projection 227 can be replaced by a through hole, and the first and second positioning holes 126, 127 can be replaced by a projection.

While the present invention has been illustrated by the description of preferred embodiments thereof, and the preferred embodiments have been described in considerable detail, it is not intended to restrict or in any way limit the scope of the appended claims to details. Additional advantages and modifications within the spirit and scope of the present invention will readily appear to those skilled in the art. The present invention is not limited to the specific details and illustrative examples described.

What is claimed is:

1. A mounting assembly comprising:
   an expansion card having a slot cover, the slot cover having a fixing portion;
   a chassis having a rear wall, the rear wall having a first supporting member and a second supporting member, the rear wall defining a card slot between the first and the second supporting members for the slot cover covering thereon;
   a fastener pivotally attached to the first and the second supporting members, the fastener having a flap, and a pressing portion pressing on the fixing portion of the slot cover; and
   a cover attached to the chassis and engaging with the flap to fix the fastener to the chassis;
   wherein the rear wall defines a cutout for engagingly receiving the flap therein.

2. The mounting assembly as described in claim 1, wherein a locating structure is formed on the two supporting members and the fastener, for securing the fastener to the chassis.

3. The mounting assembly as described in claim 2, wherein the locating structure comprises a through hole defined in one of the two supporting members, and a projection formed on the flap of the fastener, the projection engaging in the through hole.

4. The mounting assembly as described in claim 1, wherein the flap is formed at one end of the fastener, and the fastener forms another flap at one opposite end thereof, two pivot pins are formed on the flap and the another flap respectively, the first and the second supporting members define two pivot holes respectively therein for extension of the pivot pins therethrough.

5. The mounting assembly as described in claim 1, wherein the rear wall is formed to have a support plate, and the fixing portion of the slot cover is sandwiched between the support plate and the pressing portion of the fastener.

6. The mounting assembly as described in claim 5, wherein the fixing portion of the slot cover defines a cutout, and at least one protruding post is formed on the support plate, the post engaging in the cutout of the slot cover.

7. The mounting assembly as described in claim 6, wherein the pressing portion of the fastener defines at least one through hole for extension of the protruding post therethrough.

8. The mounting assembly as described in claim 1, wherein the slot cover forms an insert portion at an end opposite to the fixing portion, and the rear wall of the chassis defines a receiving portion therein for receiving the insert portion.

9. A mounting assembly comprising:
- a chassis comprising a rear wall, a support plate extending to an outer side of the rear wall, at least one card slot defined in the rear wall and the support plate for a slot cover covering thereon, the slot cover having a fixing portion corresponding to the slot defined in the support plate to be placed at the outer side of the rear wall;
- a fastener attached to the chassis at an inner side of the rear wall and pivotable between an unlocked position and a locked position, the fastener comprising a pressing portion extending across the rear wall from the inner side of the rear wall to the outer side of the rear wall for pressing on the fixing portion of the slot cover in the locked position and for releasing the fixing portion of the slot cover in the unlocked position;
- a locating structure formed on the chassis and the fastener for preventing the fastener from rotation in the locked position; and
- a top cover attached to the chassis;
- wherein the fastener forms a flap pressed by the top cover, thereby mounting the fastener to the chassis; and
- the rear wall defines a cutout for engagingly receiving the flap therein in the locked position.

10. The mounting assembly as described in claim 9, wherein the locating structure comprises a positioning hole defined in one of the chassis and the fastener, and a projection formed on the other of the chassis and the fastener, the projection engaging in the positioning hole in the unlocked position.

11. The mounting assembly as described in claim 9, wherein the locating structure comprises a first and a second positioning holes defined in one of the chassis and the fastener, and a projection formed on the other of the chassis and the fastener, the projection selectively engaging in the first and the second positioning holes in the unlocked position and the locked position, respectively.

12. The mounting assembly as described in claim 9, wherein the rear wall is formed to have a support plate, and the fixing portion of the slot cover is sandwiched between the support plate and the pressing portion of the fastener.

13. An electronic device comprising:
- a chassis of the electronic device comprising a wall, forming a support portion for supporting a slot cover of an expansion card thereon, a flange formed at one edge of the wall, and a cutout defined in the flange;
- a fastener pivotally attached to the wall, the fastener comprising a flap and a pressing portion for pressing the slot cover against the support portion when the fastener is pivoted to a locked position; and
- a cover detachably attached to the chassis, wherein the flap is received in the cutout when the fastener is pivoted to the locked position and the cover presses on the flap to prevent the fastener from rotating.

14. The electronic device of claim 13, wherein the fastener and the chassis form a locating structure preventing the fastener from rotation.

15. The electronic device of claim 14, wherein the flap is formed at one end of the fastener, a supporting member is formed on the wall, a projection is formed on one of the flap and the supporting member, a positioning hole is defined in the other of the flap and the supporting member, and the projection engages in the positioning hole when the fastener is pivoted to the locked position.

* * * * *